United States Patent [19]
Kurz et al.

[11] Patent Number: 6,024,792
[45] Date of Patent: Feb. 15, 2000

[54] METHOD FOR PRODUCING MONOCRYSTALLINE STRUCTURES

[75] Inventors: Wilfried Kurz, St. Sulpice; Werner Gäumann, Morges; Hans-Werner Bieler, Winterthur; Jean-Daniel Wagniére, Lausanne; Hansjakob Rusterholz, Winterthur, all of Switzerland

[73] Assignee: Sulzer Innotec AG, Winterthur, Switzerland

[21] Appl. No.: 09/026,782

[22] Filed: Feb. 20, 1998

[30] Foreign Application Priority Data

Feb. 24, 1997 [EP] European Pat. Off. ............ 97810091

[51] Int. Cl.[7] .................................................. C30B 25/04
[52] U.S. Cl. .................................. 117/9; 4/7; 4/904; 4/13
[58] Field of Search .............................. 117/4, 7, 9, 903, 117/904, 905, 913

[56] References Cited

FOREIGN PATENT DOCUMENTS

0740977A1  11/1996  European Pat. Off. .

*Primary Examiner*—Felisa Hitesheu
*Attorney, Agent, or Firm*—Townsend and Townsend and Crew LLP

[57] ABSTRACT

In the method for manufacturing monocrystalline structures, parts or workpieces of metallic super-alloys on substrates with a monocrystalline structure or monocrystalline structures, the surface of the substrate is melted with an energy beam of high energy density from an energy source. The material which is to be introduced into the monocrystalline structure is supplied to the melted region of the substrate. The supplied material is completely melted. The energy input with the energy beam is regulated and/or controlled in such a manner that the speed of solidification and the temperature gradient lie in the dendritic crystalline region in the GV diagram, outside the globulitic region.

12 Claims, 3 Drawing Sheets

METHOD FOR PRODUCING MONOCRYSTALLINE STRUCTURES

BACKGROUND OF THE INVENTION

The invention relates to a method for producing directionally solidified and monocrystalline structures, in particular from super-alloys.

Metallic workpieces with monocrystalline structures are used as parts of machines which are exposed to high mechanical, thermal and/or chemical stresses during operation. For example, the blades of gas turbines, in particular also those of rotors for airplane engines, but also those for stationary gas turbines, are manufactured of monocrystals. The manufacture of monocrystalline workpieces of this kind is done e.g. by directional solidification from the melt. These are casting processes in which the liquid metallic alloy solidifies to a monocrystalline structure, i.e. to a monocrystalline workpiece.

A special casting process for the manufacture of such workpieces is for example known in which the liquid alloy, which is located in a ceramic mold, obtains a crystal orientation in a directed temperature field, for example of a Bridgeman furnace. In this method the dentritic crystals are aligned along the thermal flux and form either a columnar crystalline grain structure (i.e. grains which extend over the full length of the workpiece and here, in accordance with the general linguistic usage, are termed "directionally solidified"), or a single crystal structure, i.e. the whole workpiece consists of a single crystal. In this process one must avoid the transition to the globular or globulitic (polycrystalline) solidification because this non-directed growth necessarily forms transverse and longitudinal grain boundaries, which negate the good characteristics of the directionally solidified or single crystal component.

When mention is made of monocrystalline structure and monocrystalline structures in the present specification, this is meant to cover both monocrystals (single crystals) which have no grain boundaries and crystal structures which have grain boundaries which extend longitudinally but no grain boundaries which extend in the transversal direction. In the second named crystalline structures one also speaks of directionally solidified structures.

When talking generally of directionally solidified structures, this means both single crystals, which have no grain boundaries, or at most small-angle grain boundaries, as well as columnar crystal structures which do have grain boundaries extending in the longitudinal direction but no transverse grain boundaries.

So-called super-alloys on a nickel (Ni), cobalt (Co) or iron (Fe) basis are used amongst others as alloys, for example for the above-mentioned monocrystalline turbine blades. Especially super-alloys on a nickel basis have excellent mechanical and chemical high temperature properties.

SUMMARY OF THE INVENTION

It is an object of the invention to provide a method by means of which it is possible to build up, on the monocrystalline structure of a substrate, a body or workpiece having a likewise monocrystalline structure.

It is possible with the new method to build up on the, for example, directionally solidified structure of a substrate, one or more layers or a body or a workpiece with the same directionally solidified structure as the substrate. This is an epitaxial method (crystal growth with the same orientation on a crystalline base is called epitaxial), in which the directed crystalline structure of the substrate is adopted by the layer or the layers which are built up. For this a globulitic structure must be avoided by a corresponding process control.

The invention provides a novel method by means of which it is possible to build up one or more layers or a body or workpiece with monocrystalline structure on a substrate with monocrystalline structure or monocrystalline structures respectively. The method is an epitaxial procedure in which the crystalline structure of the substrate is adopted by the layer or layers which are built up.

Hitherto, there was no possibility of so repairing or reconditioning a monocrystalline or single crystal workpiece, so that the single crystal structure of the basic material is also present at the reconditioned position. With the new process, it is now possible to monocrystallinically recondition damaged and worn single crystal workpieces, i.e. to supplement and newly build up the ideal crystal structure. In this method, the substrate, for example a monocrystalline turbine blade, is built up and further developed monocrystallinically layer by layer until the original size and shape of the workpiece has again been achieved.

The method for building up monocrystals of the same material, or of approximately the same material as the substrate, or of a material different from the substrate, enables, for example, the reconstitution, reconditioning or supplementation of workpieces having monocrystalline structures and which are damaged or worn. For instance, there are rotor blades of gas turbines nowadays which consist of monocrystalline structures of so-called metallic super-alloys and which can be repaired by the method when they are damaged.

Monocrystalline workpieces can be manufactured from the melt by so-called directional solidification. However, such parts manufactured by directional solidification are also subject to wear. Previously there was however no possibility of repairing/reconditioning a workpiece of this kind in a monocrystalline or directionally solidified manner, i.e. of building up again the monocrystalline structure of a worn workpiece in a monocrystalline manner. With the new method it is now also possible to recondition damaged and worn monocrystalline workpieces in a monocrystalline manner, i.e. to supplement and rebuild the crystal structure anew. In this process, layer upon layer is built up and further up in a monocrystalline manner on the substrate, e.g. a monocrystalline rotor blade, until the original size and form of the workpiece has been reached again.

Laser beams, electron beams and also arc methods such as e.g. Micro-TIG or plasma methods are suitable as the energy or heat source for carrying out the method, that is, energy sources by means of which it is possible to introduce large amounts of energy onto a very small area or into a small volume in a concentrated manner.

The beam of high energy and energy density is directed toward the surface of the substrate so that the surface layer of the substrate melts lightly. The material is supplied to the working region of the beam in powder form or in the form of a wire. The supplied material is likewise melted. The melting of this supplied material can be carried out in the liquid puddle of the melted surface layer or already on the way to the liquid puddle. The process is preferably carried out under inert gas and/or in a vacuum.

If now the solidification of the melt proceeds under conditions which lie outside the globulitic region, that is, in the region in which the material used solidifies directionally, the workpiece solidifies in a monocrystalline form, i.e.

grows on the substrate as an epitaxial structure. With metals, one speaks of globulitic solidification if they do not solidify directionally. One or more grain boundaries then necessarily form in the transition from directional monocrystalline to the non-directional structure which nullify the advantages of the single crystal.

The monocrystalline structure is applied layer for layer in the form of thin layers, plates or complex forms of about one millimeter or of a fraction of a millimeter.

If the substrate is e.g. inductively brought to a preheating temperature in the range from 750° C. to 1100° C. and if this temperature is e.g. maintained during the build-up, then the stresses in the substrate and in the built up single crystal, and also those between the substrate and the crystalline structure built up epitaxially thereon, are reduced, which contributes to the prevention of re-crystallization and creep in the crystalline structure.

Thermal annealing of the substrate and of the newly built up monocrystalline layer during a period of about an hour at a temperature in the range from about 1000° C. to 1250° C., for CMSX-4 at approx. 1150° C., and subsequent slow cooling down reduces inner stresses which could lead to the destruction of the monocrystalline structures through re-crystallization and creep. The low stress annealing could however also be done with a HF device directly after the application of the epitaxial layer.

The invention will be explained in detail in the following with reference to exemplary embodiments of the method. The figures serve to explain the essential parameters of the method and schematically show a laser apparatus which is suitable for carrying out the method.

DESCRIPTION OF THE PREFERRED EMBODIMENTS

Figure 1:
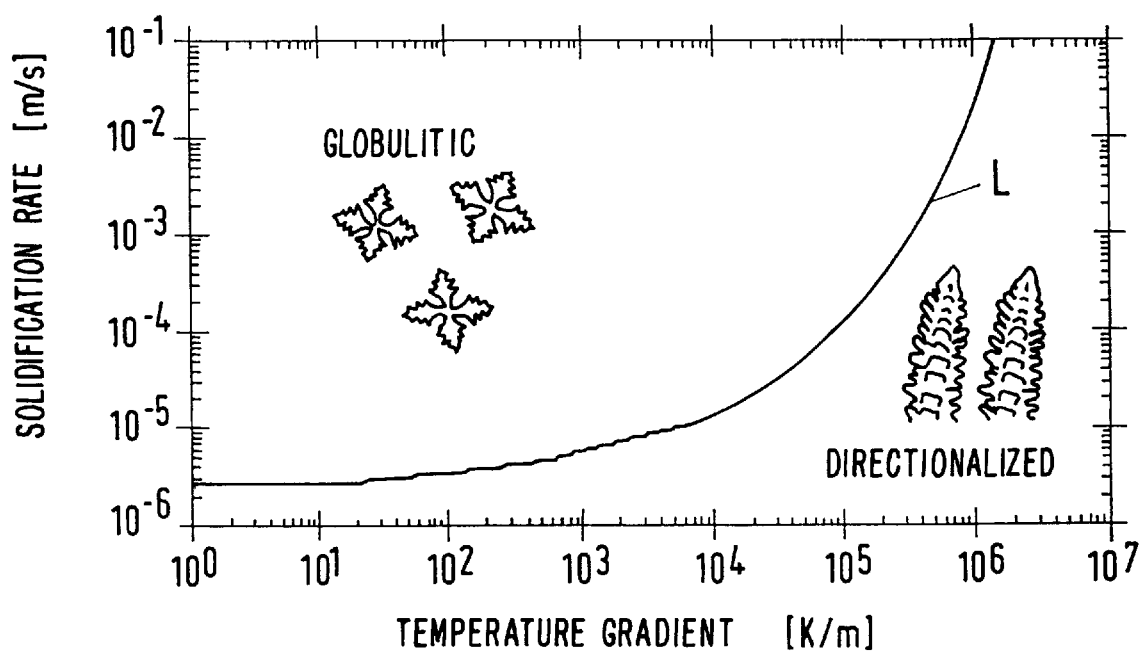
FIG. 1 shows the temperature gradient (G)/solidification rate (V) diagram in a log-log representation, the so-called GV diagram (GV standing for "gradient velocity" i.e. "temperature gradient/solidification rate")

FIG. 1 shows the typical GV diagram of a super-alloy such as CMSX-4, for example, a nickel based super-alloy which has the following composition in percentage by weight: C<0.006; Cr 6.5; Co 9.7; Mo 0.6; W 6.4; Ti 1.0; Al 5.6; Ta 6.5; Re 3.0; Hf 0.09; remainder Ni.

The GV diagram is different for different metals and metallic alloys and can be calculated or experimentally determined for each alloy. The curve L separates the GV diagram into the region of the two parameters solidification rate and temperature gradient in which the alloy solidifies globulistically from that in which the alloy solidifies to a dendritically directed structure. A description and an explanation of the GV diagram can be found e.g. in Material Science Engineering Volume 65, 1984 in the publication of J. D. Hunt on "Columnar to Equiangular Transition".

If the method is carried out using a laser, the temperature gradient should be greater than $4 \times 10^{5}$° K/m at a solidification rate of e.g. $10^{-3}$ m/s in order that a monocrystalline structure can grow epitaxially on the substrate in accordance with the invention (the oriented crystalline growth on a crystalline substrate, i.e. on a crystalline structure, is called epitaxy).

For the method this means that e.g. the laser beam must be passed over the substrate at a speed of about $10^{-3}$ m/s when the energy supply using the laser beam is chosen in such a manner that a temperature gradient of greater than $6 \times 10^{5}$° K/m is maintained at the solidification front.

Alternatively it also means, with respect to the method, that the laser beam, for example, must be moved at a speed of approximately $10^{-3}$ m/s over the substrate when the energy supply with the laser beam is selected so that the temperature gradient of $6 \times 10^{5}$° K/m is maintained in the region of the phase boundary solid/liquid in the melt, between the working point (the point or region where the laser beam strikes the liquid puddle) in the liquid puddle and the solidification front In practice, the speed at which the laser beam is passed over the substrate will lie in the range from 0.001 m/sec to 0.1 m/sec. The energy of the laser beam must be set, in accordance with the GV diagram for the alloy selected, in such a manner that the temperature gradient from the working point to the solidification boundary or to the moving solidification front is greater than about $10^{6}$° K/m to $1.5 \times 10^{6}$° K/m depending on the speed selected.

Figure 2:
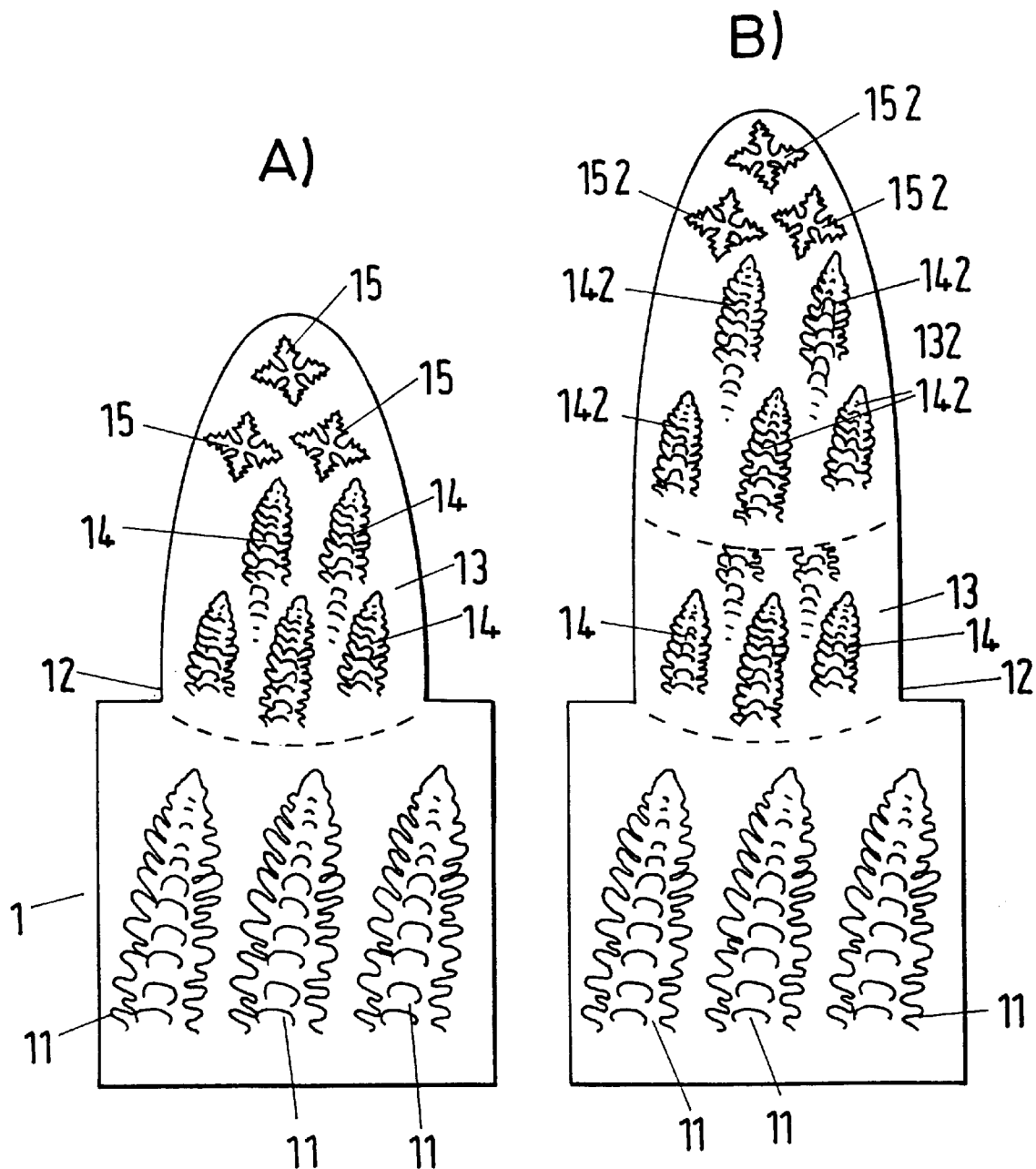
FIGS. 2A and B show the crystalline structure of a workpiece built up and reconditioned in accordance with the invention.

As shown in FIGS. 2A and 2B, the substrate 1 has a monocrystalline, dendritic structure with the dendrites 11. All dendrites are similarly oriented along the three spatial axes. FIG. 2A schematically illustrates a first monocrystalline, epitaxial layer produced on the substrate in accordance with the method. FIG. 2B schematically illustrates a structure of this kind which is built up of two layers. The build-up of the monocrystalline structure takes place in the same manner through successive layering of an arbitrary number of further epitaxial layers.

This structure is melted at the surface by the laser beam; the material is supplied to the liquid, molten bath e.g. as a wire or a powder (not shown). The material supplied, which can have a monocrystalline or polycrystalline structure, is brought into the molten base material in the re-melting zone 12 and completely melted. This supplied material, that is, e.g. the melted powder, then solidifies to a layer 13 as a dendritic monocrystal or, respectively, to a monocrystalline structure with monocrystalline dendrites, i.e. to a dentritic single crystal 14. In the upper boundary region, so-called globulites 15 mainly form, as a result of the thermal conditions and/or not fully melted powder particles, which can disturb the monocrystalline structure, inasmuch as they could serve as a nucleus for a dendrite which disturbs the monocrystalline structure.

When the second epitaxial layer 132 is applied, the globulitic dendrites are again re-melted and solidify in the form of directed dendrites 142, i.e. as monocrystals. Globulitic dendrites again form on the surface of this second epitaxial layer 132 as well.

Monocrystalline structures can be built up of for example CMSX-4 on a substrate of CMSX-4 with the method in accordance with the invention under the following conditions:

Laser type: 1.5 kw $CO_2$ laser

Diameter of the laser spot: 2.5 mm (diameter of the laser beam on the substrate or on the prior layer)

Powder: CMSX-4 powder with a particle size (mesh) in the range of about 40–70 μm diameter Substrate: CMSX-4 single crystal
Protective gas: Argon (Ar); 35 liters/min
For the first layer (track) on the substrate:
Laser power: approx. 900 W
Speed of the laser spot on the substrate: approx. 4.2 mm/sec (250 mm/min)
For the second layer (track):
Offset of the powder injection nozzle and of the laser beam along the optical axis, i.e. behind the molten puddle, relative to the process direction: circa 100 μm (for the second layer)
Laser power: approx. 600 W
Speed of the laser spot: approx. 500 mm/min (8.4 mm/sec)
Third and further layers (tracks):
Offset of the powder injection nozzle behind the molten puddle, relative to the process direction: approx. 70 μm
Laser power: approx. 600 W
Speed of the laser spot on the substrate: approx. 750 mm/min.

The first layer is applied to the monocrystalline substrate; the second layer onto the epitaxially produced first layer, etc., with the following layer in each case being deposited on the preceding one.

It should be observed that the growing of a monocrystalline layer presupposes that the supplied material is completely melted. If this is not the case, then e.g. not completely melted powder grains form crystallization nuclei for dendrites and crystals which disturb and destroy the monocrystalline growth of the structure.

In the build-up of a larger structure or of a larger body with the epitaxial method, globulitic domains form at the surface of the last produced layer. These "equiaxed grains" are seeds which disturb or interrupt the directed growth of the crystals.

During the build-up of the next, overlying layer it is thus of great importance that these globulites are completely melted down so that dendrites which would disturb and destroy the monocrystalline structure disappear i.e. do not arise at all beneath the surface.

Other super-alloys with which monocrystalline structures can be built up by the method in accordance with the present invention are, for example, IN 738LC, IN 939, IN 100, B 1914, CM 99, SRR 99, CM-247 LC, CMSX-2, CMSX-3, CMSX-6, Mar-M002.

Figure 3:
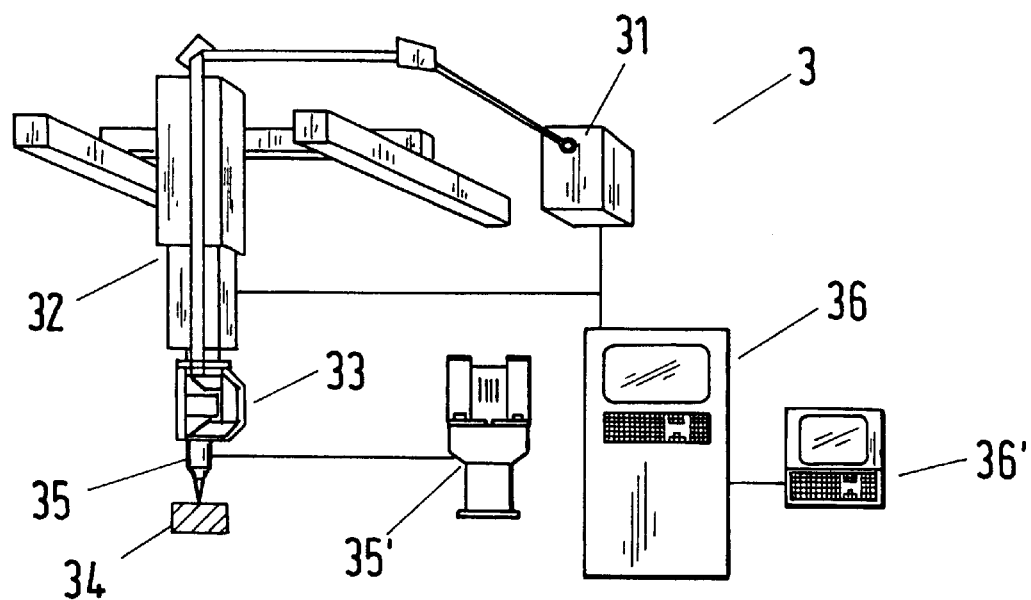
FIG. 3 shows a schematic apparatus which is suitable for carrying out the method of the present invention.

The plant 3 schematically illustrated in FIG. 3 for carrying out the method comprises the laser, e.g. a $CO_2$ laser 31. The beam of the laser 31 is deflected to the CNC-controlled beam guidance system 32 by the laser beam focusing optics 33 and arrives then at the substrate or workpiece 34 on which the crystalline structure is to be built up. The CNC system 36 which controls and regulates the process can be programmed at the programming terminal 36'. The powder forwarder 35' brings the material to the coating module 35, and from there the material, for example in powder form, is conveyed/blown to the molten puddle on the substrate 34, where the material is first completely melted and then solidifies to the monocrystalline structure. The inert gas shield can also be produced by the coating module 35.

Figure 4:
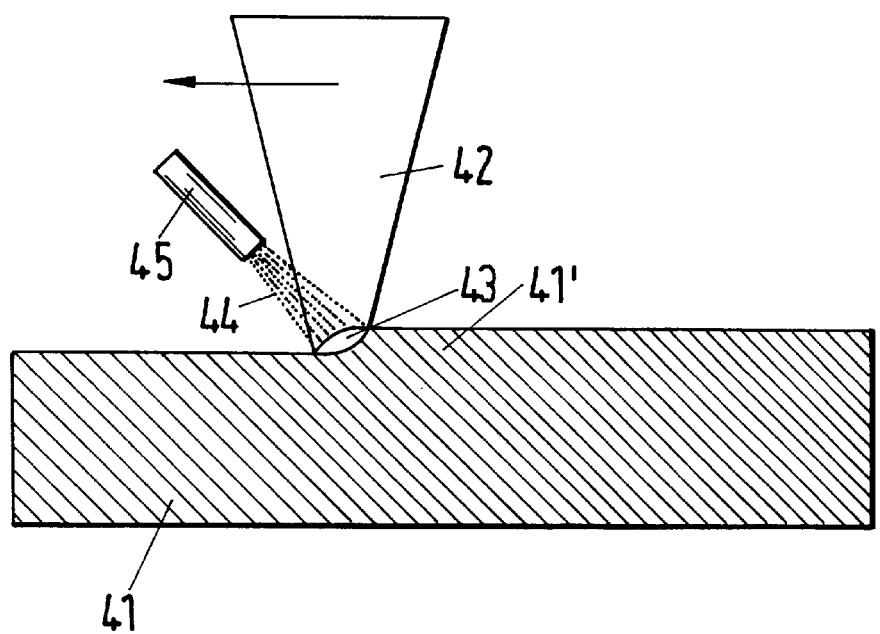
FIG. 4 is a schematic illustration of the process of applying a trail or track on the basic material by blowing powder into the molten puddle formed by the high energy beam.

Finally, FIG. 4 shows schematically the e.g. monocrystalline substrate 41. The laser beam 42 melts the surface of the substrate 41. The molten puddle 43 forms, into which the material is blown in powder form 44 from the powder nozzle 45 to the molten puddle 43. The laser beam, and with it also the molten puddle 43, a melt zone, moves in the direction of the arrow. The molten puddle solidifies to the epitaxial layer 41', which has the crystalline structure of the substrate 41.

The method with an electron beam as the energy source is carried out in a vacuum. The method could also be carried out in a vacuum with a laser as the energy source. No inert gas is required in a vacuum; but in return, the manipulation of the energy source, the substrate and the material to be supplied can present problems. Moreover, suitable vacuum chambers are not available as a rule in any desired size.

In the method for manufacturing monocrystalline structures, parts or workpieces of metallic super-alloys on substrates with a monocrystalline structure or monocrystalline structures, the surface of the substrate is melted with an energy beam of high energy density from an energy source. The material which is to be introduced into the monocrystalline structure is supplied to the melted region of the substrate. The supplied material is completely melted. The energy input with the energy beam is regulated and/or controlled in such a manner that the speed of solidification and the temperature gradient lie in the dendritic crystalline region in the GV diagram, outside the globulitic region.

What is claimed is:

1. A method for producing monocrystalline structures, parts or workpieces of metallic super-alloys on substrates with a monocrystalline structure or monocrystalline structures characterized in that:
    a surface of the substrate is melted with an energy beam of an energy source,
    a material which is to be introduced into the monocrystalline structure is supplied to the melted region,
    the material is completely melted, and
    an energy input is regulated in such a manner that the rate of solidification and the temperature gradient lie in a dentritic crystalline region in the GV diagram and outside a globulitic region.

2. A method in accordance with claim 1 in which a laser beam, an electron beam or an arc is used as an energy beam of high energy density.

3. A method in accordance with claim 1 in which the material which is to be introduced into the monocrystalline structure is supplied in powder form or in the form of a wire.

4. A method in accordance with claim 1 in which the supplied material is the same as that of the substrate or
    in which the supplied material is different and has a crystalline structure similar to that of the substrate.

5. A method in accordance with claim 1 in which at least one of the substrate and the material which is to be introduced into a monocrystalline structure is a metallic super-alloy on a Co basis or on a Fe basis or on a Ni basis, such as CMSX-4.

6. A method in accordance with claim 1 in which the substrate is preheated to a preheating temperature, preferably in the temperature range from 800° C. to 1000° C., with the preheating temperature preferably being held constant during the production of the epitaxial layer.

7. A method in accordance with claim 6 in which the preheating of the substrate is carried out inductively.

8. A method in accordance with claim 1 in which the crystalline structure produced is subsequently annealed to low internal stresses preferably at a temperature in the range from 1000° C. to 1250° C., preferably at about 1150° C.

9. A method in accordance with claim 1 which is carried out under protective gas or in a vacuum, with the protective gas preferably flowing laminarly or largely laminarly in the region of the process.

10. Use of the method in accordance with claim 1 for supplementing the monocrystalline structure of a worn monocrystalline turbine blade, in particular of a rotor blade of a gas turbine or of an airplane engine.

11. A method for producing a microcrystalline structure of a metallic super-alloy on a surface of a substrate comprising the steps of:
- melting a region of the surface of the substrate with an energy beam from an energy source;
- supplying a material to be introduced into the monocrystalline structure to the surface region where the substrate is melted;
- completely melting the material; and
- controlling an energy input by the beam to the material so that a rate of solidification and a temperature gradient lie in a dentritic crystalline region in a GV diagram and outside a globulitic region.

12. A method for supplementing a monocrystalline structure of a worn portion of a monocrystalline turbine blade, the method comprising the steps of:
- melting a region of a surface of the substrate with an energy beam from an energy source;
- supplying a material to be introduced into the monocrystalline structure to the surface region where the substrate is melted;
- completely melting the material; and
- controlling an energy input by the beam to the material so that a rate of solidification and a temperature gradient lie in a dentritic crystalline region in a GV diagram and outside a globulitic region.

* * * * *